(12) United States Patent
Fender et al.

(10) Patent No.: US 11,379,450 B2
(45) Date of Patent: Jul. 5, 2022

(54) RELATIONAL METHOD FOR TRANSFORMING UNSORTED SPARSE DICTIONARY ENCODINGS INTO UNSORTED-DENSE OR SORTED-DENSE DICTIONARY ENCODINGS

(71) Applicant: Oracle International Corporation, Redwood Shores, CA (US)

(72) Inventors: Pit Fender, Union City, CA (US); Felix Schmidt, Niederweningen (CH); Benjamin Schlegel, Merced, CA (US)

(73) Assignee: Oracle International Corporation, Redwood Shores, CA (US)

( * ) Notice: Subject to any disclaimer, the term of this patent is extended or adjusted under 35 U.S.C. 154(b) by 33 days.

(21) Appl. No.: 16/155,740

(22) Filed: Oct. 9, 2018

(65) Prior Publication Data

US 2020/0110820 A1 Apr. 9, 2020

(51) Int. Cl.

| G06F 16/22 | (2019.01) |
| G06F 7/08 | (2006.01) |
| H03M 7/30 | (2006.01) |
| G06F 16/21 | (2019.01) |
| G06F 16/25 | (2019.01) |

(52) U.S. Cl.
CPC ........... *G06F 16/2282* (2019.01); *G06F 7/08* (2013.01); *G06F 16/212* (2019.01); *G06F 16/221* (2019.01); *G06F 16/258* (2019.01); *H03M 7/3088* (2013.01)

(58) Field of Classification Search
CPC .. G06F 16/2282; G06F 16/221; G06F 16/212; G06F 16/258; G06F 7/08; H03M 7/3088

USPC ......................................... 707/693, 748, 752
See application file for complete search history.

(56) References Cited

U.S. PATENT DOCUMENTS

| 5,440,735 A | 8/1995 | Goldring |
| 6,954,758 B1 | 10/2005 | O'Flaherty |
| 7,647,291 B2 | 1/2010 | Mosescu |
| 10,055,506 B2 | 8/2018 | Rhodes |
| 10,474,652 B2 * | 11/2019 | Baskett ............... G06F 16/3331 |
| 10,901,948 B2 | 1/2021 | Ackerman et al. |
| 2002/0174111 A1 | 11/2002 | Kougiouris |
| 2004/0225673 A1 * | 11/2004 | Beck .................... G06F 16/285 |
| 2006/0015510 A1 | 1/2006 | Trask |
| 2007/0050367 A1 | 3/2007 | Suganuma |
| 2008/0086444 A1 | 4/2008 | Yu et al. |
| 2008/0306903 A1 | 12/2008 | Larson et al. |

(Continued)

OTHER PUBLICATIONS

Westmann et al., "The Implementation and Performance of Compressed Databases", SIGMOD Rec., 29(3): pp. 55-67, 2000.

(Continued)

Primary Examiner — Hares Jami
(74) Attorney, Agent, or Firm — Hickman Becker Bingham Ledesma LLP

(57) ABSTRACT

Unsorted sparse dictionary encodings are transformed into unsorted-dense or sorted-dense dictionary encodings. Sparse domain codes have large gaps between codes that are adjacent in order. Unlike spare codes, dense codes have smaller gaps between adjacent codes; consecutive codes are dense codes that have no gaps between adjacent codes. The techniques described herein are relational approaches that may be used to generate sparse composite codes and sorted codes.

10 Claims, 16 Drawing Sheets

(56) References Cited

U.S. PATENT DOCUMENTS

| | | | |
|---|---|---|---|
| 2009/0254513 | A1 | 10/2009 | Luukkala et al. |
| 2010/0030748 | A1 | 2/2010 | Netz |
| 2010/0049730 | A1 | 2/2010 | Qiao et al. |
| 2010/0121863 | A1 | 5/2010 | Reed et al. |
| 2010/0262574 | A1 | 10/2010 | Zhou |
| 2010/0328115 | A1 | 12/2010 | Binnig |
| 2011/0161387 | A1 | 6/2011 | Krueger |
| 2012/0124106 | A1 | 5/2012 | Allen |
| 2013/0060780 | A1* | 3/2013 | Lahiri ............... H03M 7/42 707/741 |
| 2013/0103701 | A1 | 4/2013 | Vishnubhatta |
| 2014/0095470 | A1 | 4/2014 | Chen et al. |
| 2014/0317087 | A1 | 10/2014 | Collins |
| 2015/0074407 | A1 | 3/2015 | Palmeri |
| 2015/0178305 | A1 | 6/2015 | Mueller |
| 2015/0261882 | A1 | 9/2015 | Roberts |
| 2015/0278268 | A1* | 10/2015 | El-Ali ............... G06F 16/245 707/722 |
| 2016/0147804 | A1* | 5/2016 | Wein ............... G06F 16/2228 707/600 |
| 2016/0241577 | A1 | 8/2016 | Johnson |
| 2017/0031976 | A1 | 2/2017 | Chavan |
| 2017/0109406 | A1* | 4/2017 | Chavan ............... G06F 16/221 |
| 2017/0242876 | A1 | 8/2017 | Dubost |
| 2018/0150494 | A1* | 5/2018 | Schulze ............... G06F 16/2228 |
| 2018/0211143 | A1 | 7/2018 | Haruta |
| 2018/0218020 | A1 | 8/2018 | Dutta |
| 2019/0102346 | A1 | 4/2019 | Wang et al. |
| 2019/0102427 | A1 | 4/2019 | Chakkappen et al. |
| 2019/0155925 | A1 | 5/2019 | Giannikis et al. |
| 2019/0155930 | A1 | 5/2019 | Fender et al. |
| 2019/0205446 | A1 | 7/2019 | Kandukuri et al. |
| 2019/0236474 | A1 | 8/2019 | Smith et al. |
| 2019/0251194 | A1 | 8/2019 | Fender et al. |
| 2020/0394191 | A1 | 12/2020 | Fender |
| 2020/0394192 | A1 | 12/2020 | Fender |
| 2021/0390089 | A1 | 12/2021 | Fender et al. |

OTHER PUBLICATIONS

Ristov, Strahil, LZ Trie and Dictionary Compression, Software: Practice and Experience, vol. 35, Issue 5, pp. 445-465, Apr. 25, 2005.

Ray et al., "Database Compression: A Performance Enhancement Tool", Proc. of 7th Intl. Conf. on Management of Data, COMAD, 1995, 20 pages.

Poess et al., "Data Compression in Oracle", VLDB 2003: Proceedings of the 29th International Conference on Very Large Data Bases, pp. 937-947.

Binnig et al., "Dictionary-based order-preserving string compression for main memory column stores", ACM SIGMOD 2009, 13 pages.

Antoshenkov et al., "Order Preserving Compression", ICDE 1996: Proceedings of the Twelfth International Conference on Data Engineering, pp. 655-663.

Abadi et al., "Integrating Compression and Execution in Column-Oriented Database Systems", SIGMOD 2006, pp. 671-682.

Palkar, et al., "Filter Before You Parse: Faster Analytics on Raw Data with Sparser", Proceedings of the VLDB Endowment, vol. 11, No. 11, dated 2018, 14 pages.

Mustard et al., "JumpGate: Towards In-Network Data Processing", dated 2019, 3 pages.

Kornacker et al., "Impala: A Modern, Open-Source SQL Engine for Hadoop", 7th Biennial Conference on Innovative Data Systems Research (CIDR'15) dated Jan. 4-7, 2015, 10 pages.

Balkesen et al., "RAPID: In-Memory Analytical Query Processing Engine with Extreme Performance perWatt", SIGMOD'18, Jun. 10-15, 2018, Houston, TX, USA, 13 pages.

Agrawal et al., "A Many-core Architecture for In-Memory Data Processing", MICRO-50, Oct. 14-18, 2017, Cambridge, MA, USA, 14 pages.

Wust et al., "Sparse Dictionaries for In-Memory Column Stores", DBKDA 2012, 9 pages.

Vagata et al., "Scaling the Facebook data warehouse to 300 PB", dated Apr. 10, 2014, 10 pages.

Sanders et al., "Optimize storage with deep compression in DB2 10", dated , May 17, 2012, 41 pages.

Patil et al., "Inverted Indexes for Phrases and Strings", SIGIR darted 2011, 10 pages.

Bentley, et al., "Fast Algorithms for Sorting and Searching Strings", SODA 1997, 10 pages.

Bender et al., "Anti-Persistence on Persistent Storage: History-Independent Sparse Tables and Dictionaries", PODS'16, June. 26-Jul. 1, 2016, San Francisco, CA, USA, 14 pages.

Antoshenkov et al., "Order Preserving Compression", ICDE, dated 1996, 9 pages.

Kandukuri, U.S. Appl. No. 15/861,212, filed Jan. 3, 2018, Office Action, dated Jan. 3, 2020.

Fender, U.S. Appl. No. 15/897,375, filed Feb. 15, 2018, Office Action, dated Jan. 17, 2020.

Fender, U.S. Appl. No. 15/819,193, filed Nov. 21, 2017, Office Action, dated Dec. 27, 2019.

Fender, U.S. Appl. No. 15/897,375, filed Feb. 15, 2018, Final Office Action, dated Jul. 24, 2020.

Giannikis, U.S. Appl. No. 15/819,891, filed Nov. 21, 2017, Notice of Allowance, dated Oct. 7, 2020.

Su et al. "Approximate Aggregates in Oracle 12C", CIKM'16 , dated Oct. 24-28, 2016, Indianapolis, IN, USA, ACM, 10 pages.

Heule et al., "HyperLogLog in Practice: Algorithmic Engineering of a State of The Art Cardinality Estimation Algorithm", EDBT/ICDT '13 Mar. 18-22, 2013, Genoa, Italy Copyright 2013 ACM, 10 pages.

Haas et al., "Sampling-Based Estimation of the Number of Distinct Values of an Attribute", Proceedings of the 21st VLDB Conference, dated 1995, 12 pages.

Flajolet et al., "HyperLogLog: the analysis of a near-optimal cardinality estimation algorithm", dated 2007 Conference on Analysis of Algorithms, 22 pages.

Charikar et al., "Towards Estimation Error Guarantees for Distinct Values", dated 2000, 12 pages.

Ahmed et al., "Automated Generation of Materialized Views in Oracle", Proceedings of the VLDB Endowment, vol. 13, No. 12, dated Aug. 2020, 13 pages.

Agarwal, Nipun, "MySQL Analytics Service", Oracle Labs, dated 2019, 22 pages.

Fender et al., U.S. Appl. No. 16/441,989, filed Jun. 14, 2019, Non-Final Office Action dated May 26, 2021.

Fender et al., U.S. Appl. No. 15/897,375, filed Feb. 15, 2018, Notice of Allowance dated May 14, 2021.

Fender et al., U.S. Appl. No. 15/897,375, filed Feb. 15, 2018, Supplemental Notice of Allowability dated Aug. 19, 2021.

Fender et al., U.S. Appl. No. 15/819,193, filed Nov. 21, 2017, Notice of Allowance dated May 26, 2021.

Fender et al., U.S. Appl. No. 15/819,193, filed Nov. 21, 2017, Corrected Notice of Allowability dated Jun. 7, 2021.

Budalakoti, U.S. Appl. No. 17/168,459, filed Feb. 5, 2021, Non-Final Rejection dated Apr. 11, 2022.

* cited by examiner

FIG. 6B

```sql
CREATE TABLE encode_op_tab as (
SELECT ENCODE_SPARSE_CODE () OVER
        (PARTITION BY <token_column>) as code_sparse
        ENCODE_FLAG_FIRST OVER
        (PARTITION BY <token_column>) as to_filter,
        <token_column> as token
        rid as id
FROM decoded_base_tab CREATE TABLE encode_stats_tab AS (
SELECT EXTRACT (ENCODING_SITE FROM code_sparse) as node_id,
       max (EXTRACT (LOCAL_CODE FROM code_sparse)) as  ndv
FROM encode_op_tab
GROUP BY EXTRACT ( ENCODING_SITE FROM code_sparse))

CREATE TABLE encode_node_helper AS(
SELECT node_id
FROM encode_stats _tab)

CREATE TABLE encode _ offest_tab AS (
SELECT SUM ( s.ndv) as offset, h.node_id
WHERE s.node_id <= h.node_id
GROUP by h.node_id)

CREATE TABLE  tmp_dic_tab AS (
SELECT  g.offset - EXTRACT (LOCAL_CODE FROM code_sparse) as code_dense,
        to_filter,
        token,
        id
FROM encode_offset_tab  g, encode_op_tab e
WHERE g.node_ID = EXTRACT (ENCODING_SITE FROM code_sparse))

CREATE TABLE  dict_tab as (
SELECT code_dense as code,
        token
FROM tmp_dict_tab
WHERE to_filter =1)

CREATE TABLE encoded_base_tab as (
select b...,
      d.code as string_col
FROM decoded_base_tab b,  emp_dict_tab d
WHERE b.rid = d.id;
```

FIG. 8A

Sparsely-encoded Table 610

| Id 611 | Token 612 | Sparse composite codes 613 | Flags 614 |
|---|---|---|---|
| 0001 | Scott | 11 | True |
| 0002 | Scott | 11 | False |
| 0003 | Miller | 21 | True |
| 0004 | Miller | 21 | False |
| 0005 | Jones | 22 | True |
| 0006 | Miller | 21 | False |
| 0007 | Jones | 22 | False |
| 0008 | Scott | 11 | False |

NDV Table 620

| Node Id 621 | Number of distinct values 622 |
|---|---|
| 1 | 1 |
| 2 | 2 |

FIG. 8B

NDV Table 700

| Node Id 701 | Number of distinct values 702 |
|---|---|
| 1 | 100 |
| 2 | 200 |
| 4 | 300 |
| 5 | 400 | ics
RELATIONAL METHOD FOR TRANSFORMING UNSORTED SPARSE DICTIONARY ENCODINGS INTO UNSORTED-DENSE OR SORTED-DENSE DICTIONARY ENCODINGS

TECHNICAL FIELD

Embodiments are generally related to information storage and retrieval technology. More specifically, embodiments are related to relational dictionaries.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Database Overview

Generally, a server, such as a database server, is a combination of integrated software components and an allocation of computational resources, such as memory, a node, and processes on the node for executing the integrated software components, where the combination of the software and computational resources are dedicated to providing a particular type of function on behalf of clients of the server. A database server governs and facilitates access to a particular database, processing requests by clients to access the database.

Users interact with a database server of a database management system (DBMS) by submitting to the database server commands that cause the database server to perform operations on data stored in a database. A user may be one or more applications running on a client computer that interact with a database server. Multiple users may also be referred to herein collectively as a user.

A database comprises data and a database dictionary that is stored on a persistent memory mechanism, such as a set of hard disks. A database is defined by its own separate database dictionary. A database dictionary comprises metadata that defines database objects contained in a database. Database objects include tables, table columns, and tablespaces. A tablespace is a set of one or more files that are used to store the data for various types of database objects, such as a table. If data for a database object is stored in a tablespace, a database dictionary maps a database object to one or more tablespaces that hold the data for the database object.

A database dictionary is referred to by a DBMS to determine how to execute database commands submitted to a DBMS. Database commands can access the database objects that are defined by the dictionary.

A database command may be in the form of a database statement. For the database server to process the database statements, the database statements must conform to a database language supported by the database server. One non-limiting example of a database language that is supported by many database servers is SQL, including proprietary forms of SQL supported by such database servers as Oracle, (e.g. Oracle Database 11g). SQL data definition language ("DDL") instructions are issued to a database server to create or configure database objects, such as tables, views, or complex types. Data manipulation language ("DML") instructions are issued to a DBMS to manage data stored within a database structure. For instance, SELECT, INSERT, UPDATE, and DELETE are common examples of DML instructions found in some SQL implementations. SQL/XML is a common extension of SQL used when manipulating XML data in an object-relational database.

A multi-node database system is made up of interconnected nodes that share access to the same database. The nodes can be interconnected via a network and share access, in varying degrees, to shared storage, e.g. shared access to a set of disk drives and data blocks stored thereon. The nodes in a multi-node database system may be in the form of a group of computers (e.g. work stations, personal computers) that are interconnected via a network. Alternately, the nodes may be the nodes of a grid, which is composed of nodes in the form of server blades interconnected with other server blades on a rack.

Each node in a multi-node database system hosts a database server. A server, such as a database server, is a combination of integrated software components and an allocation of computational resources, such as memory, a node, and processes on the node for executing the integrated software components on a processor, the combination of the software and computational resources being dedicated to performing a particular function on behalf of one or more clients.

Resources from multiple nodes in a multi-node database system can be allocated to running a particular database server's software. Each combination of the software and allocation of resources from a node is a server that is referred to herein as a "server instance" or "instance". A database server may comprise multiple database instances, some or all of which are running on separate computers, including separate server blades.

Dictionary Compression

A column of database data can be stored in a compressed format to conserve space in memory. Often used is a compression technique referred to herein as "dictionary encoding", which enables data that comprises a relatively large number of bits to be represented by a relatively small number of bits. The relatively large number of bits corresponds to a value of database data and is hereinafter referred to as a "token". The relatively small number of bits corresponds to an encoded representation of the token and is hereinafter referred to as a "code". An example of a token is a string, and an example of a code is one memory word integer. Tokens and codes exhibit a one-to-one relationship with each other.

Dictionary encoding uses mappings that enable translation between tokens and codes and vice versa. A token-to-code mapping enables compression of database data, such as when a database table is loaded into a database system; and a code-to-token mapping enables decompression of database data, such as when a query is evaluated over the database table. A token-to-code mapping is hereinafter referred to as an "encoding dictionary", and a code-to-token mapping is hereinafter referred to as a "decoding dictionary". Encoding dictionaries and decoding dictionaries are may be maintained in relatively fast but small memory along with the compressed data with which they are associated. As used herein, a dictionary is said to be "for" or "associated with" database data if the dictionary is to be used for compressing and/or decompressing the database data.

An approach to dictionary encoding is relational encoding. Under the relational approach, a set of database statements (e.g. statements written in SQL) are executed to generate a dictionary to encode a column of a base table to generate an "encoded table". The dictionary may also be used decode the encoded column in the encoded table. An advantage to a relational approach is that a query optimizer may determine the most efficient execution plans for executing the set of database statements, thereby saving computer resources (e.g. processing time, network bandwidth between database servers and storage, input/output I/O, and memory).

Dense and Sorted Codes

A dictionary may map a domain of tokens to a sparse domain of codes. A sparse domain of codes may have large gaps between codes that are adjacent in order. Dense codes have smaller gaps between adjacent codes; consecutive codes are dense codes that have no gaps between adjacent codes. For example, the following ordered set of codes 1, 10, 441, and 625 are relatively sparse while the ordered set of codes 1, 2, 3, and 4 are dense and consecutive. In general, a domain of dense codes requires less storage, in the dictionary and in the data encoded by the codes, than sparse composite codes.

A domain of sorted codes mirrors the sort order of the tokens mapped to the codes. For example, the codes 1, 2, 3 are respectively mapped by a dictionary to strings Amy, Eric, and Iris, and are sorted codes because the order of the codes is same as the order of tokens. An advantage of a sorted codes is that range predicates may be evaluated directly on codes, i.e. without decoding the codes, thereby using less processing to perform a range predicate.

Described herein are relational approaches that may be used to generate sparse composite codes and sorted codes.

BRIEF DESCRIPTION OF THE DRAWINGS

FIGS. 6A-B are flow diagrams that depict an example approach related to encoding multiple columns of database data, according to an embodiment of the present invention.

FIGS. 8A-B depict an example for generating an NDV table, according to an embodiment of the present invention.

Figure 1:
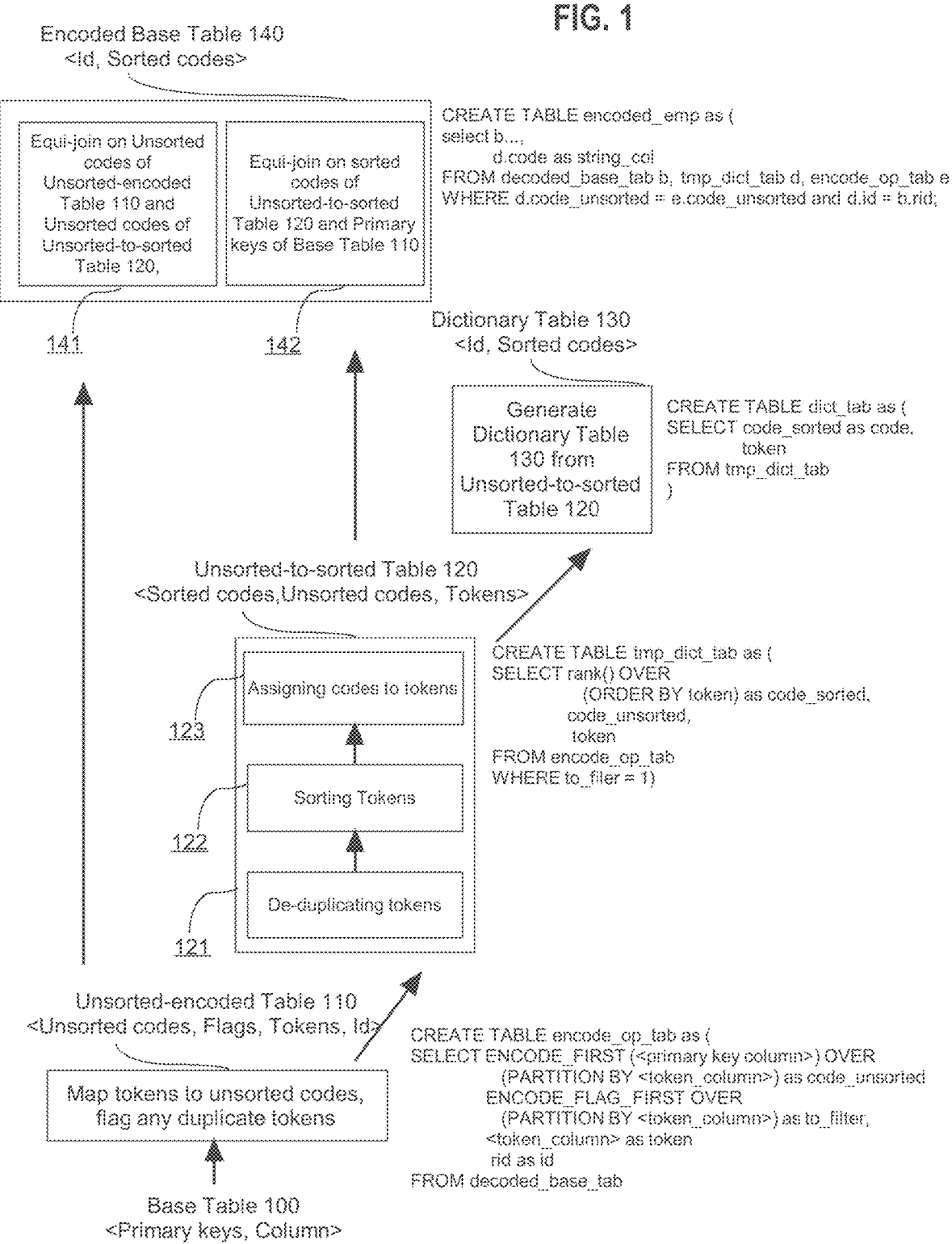
FIG. 1 is a flow diagram that depicts an example approach related to encoding a single column of database data, according to an embodiment of the present invention.

While each of the drawing figures depicts a particular embodiment for purposes of depicting a clear example, other embodiments may omit, add to, reorder, and/or modify any of the elements shown in the drawing figures. For purposes of depicting clear examples, one or more figures may be described with reference to one or more other figures, but using the particular arrangement depicted in the one or more other figures is not required in other embodiments.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention. Modifiers such as "first" and "second" are used to differentiate elements and do not necessarily indicate any particular order.

Introduction

Described herein are relational approaches for generating dense codes and for generating sorted codes. The relational approaches exploit specialized operators that are referenced by database statements written a database language, such as SQL. The operators include ENCODE_FIRST ( ), ENCODE_FLAG_FIRST ( ), and ENCODE_SPARSE_CODE. These operators are described in *Code Dictionary Generation Based On Non-Blocking Operations*, filed by Pit Fender, et al. on Feb. 15, 2018 as U.S. patent application Ser. No. 15/897,375, the entire contents of which are incorporated herein by reference.

Relational Dense Code Generation

FIG. 1 depicts an example encoding pattern for generating dense codes using a relational approach, hereinafter referred to as "Dense Relational Pattern". The Dense relational pattern describes a way of mapping tokens to dense codes. The Dense Relational Pattern may be executed on a centralized database system or on a distributed database system. In some embodiments, the Dense Relational Pattern involves four database queries: one that generates an unsorted-encoded table, one that generates an unsorted-to-sorted table based on the unsorted-encoded table, one that generates a dictionary table based on the unsorted-to-sorted table, and one that generates an encoded base table based on unsorted-to-sorted table and base table. The Dense Relational Pattern depicted in FIG. 1 is described in further detail below.

Generating Unsorted-Encoded Table

Figure 2:
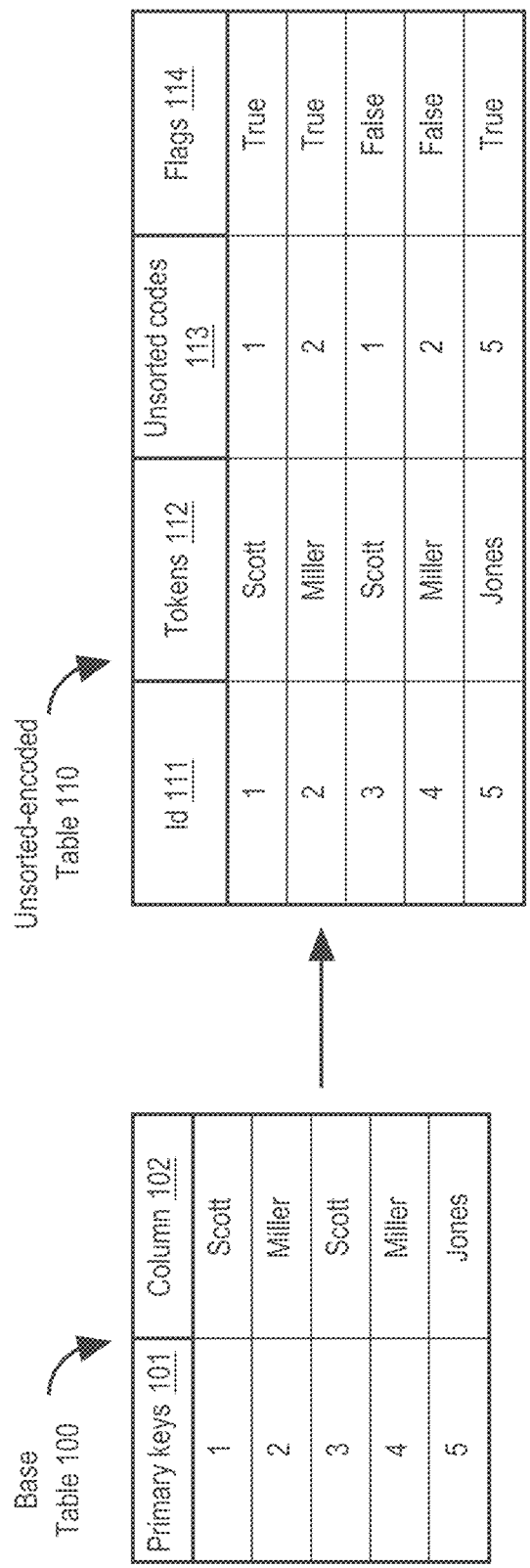
FIG. 2 depicts an example for generating an unsorted encoded table, which involves mapping codes to tokens and flagging any duplicate tokens, according to an embodiment of the present invention.

FIG. 2 depicts the generation of an unsorted-encoded table according to an example database query of Dense Relational Pattern. The unsorted-encoded table 110 in effect encodes the column 102 by unsorted codes 113. In unsorted-encoded table 110, tokens Scott, Miller, Jones are respectively mapped to unsorted counter-part codes 1, 2, 5. The database query specifies operations comprising (1) mapping tokens to unsorted code, and (2) generating flags to indicate whether or not a particular token is the first value of a set of one or more identical values.

For example, assigning codes 113 to tokens 102 can be achieved applying an ENCODE_FIRST ( ) operator. Referring to FIG. 2, ENCODE_FIRST generates codes 113.

Referring to FIG. 2, column 102 stores a set of tokens 112, each token being stored in a separate row/as a separate element of column 102. The database table comprising column 100 also has a column, virtual or otherwise, of primary keys. As used herein, a primary key refers to any information that can be used to uniquely identify a row. In the example of FIG. 2, the primary keys are primary keys 101.

In general, the ENCODE_FIRST ( ) operation uses some of the primary keys as dictionary codes. More specifically, the code that represents a set of one or more identical values is the primary keys of the first value, of the set, that is encountered.

For example, FIG. 2 depicts a set comprising "Scott" tokens in Rows 1 and 3. Since the "Scott" token in Row 1 is processed before any of the other "Scott" tokens, the primary key of the "Scott" token in Row 1 is used as the code that represents each of the "Scott" tokens. Accordingly, codes 302 comprise two instances of the code "1", each instance being correlated with a "Scott" token.

In some embodiments, correlating codes with tokens is achieved using a hash table. For example, a token may be hashed, and if a hash bucket does not already exist for the token, a hash bucket may be created. An identifier may be determined for the token, and the identifier may be stored in the hash bucket along with the token. Additionally, the token and the identifier may be provided as output. However, if a hash bucket already exists for the token, it is unnecessary to determine an identifier for the token. Instead, the token and the identifier already stored in the hash bucket may simply be provided as output.

In the example of FIG. 2, since the "Scott" token in Row 1 is the first "Scott" token that is processed, a hash bucket storing "Scott" would be generated. The token "Scott" would be correlated with the primary key "1", which would also be stored in the hash bucket. Additionally, a correlation between "Scott" and "1" would be provided as output. The "Scott" token in Row 3 would also be hashed, but since the hash value indicates that the tokens in Rows 1 and 3 have identical values, the primary key stored in the "Scott" hash bucket would simply be provided as output. Hashing the "Miller" token in Row 2 would indicate a different value from the "Scott" token. Accordingly, a hash bucket storing "Miller" would be generated; "Miller" would be correlated with the primary key "2", which would be stored in the "Miller" hash bucket; and a correlation between "Miller" and "2" would be provided as output.

Advantageously, non-blocking operations enable processing data in a streaming fashion. However, this may result in output comprising duplicate correlations. For example, the output of FIG. 2 comprises three correlations between "Scott" and "1". Some of this output can be stored as encoded database data. As shall be described below, some of this output can also be stored as a code dictionary upon removing any duplicate correlations.

Generating flags 114 to indicate whether a respective unsorted code is a first occurrence of said unsorted code can be achieved applying an ENCODE_FLAG_FIRST ( ) operator. Referring to FIG. 2, ENCODE_FLAG_FIRST generates flags 114.

For example, the "Scott" token in Row 1 is flagged as "True", because it is the first "Scott" to processed. However, the "Scott" token in Row 3 is flagged as "False", because it is not the first "Scott" to be processed. However, it should be appreciated that flags 114 may be implemented using bit flags or any other set of two or more indicators for distinguishing between distinctness and non-distinctness.

In some embodiments, flags are determined based on references to a hash table. For example, a token may be hashed, and if a hash bucket does not already exist for the token, a hash bucket may be created, and the token may be flagged as a distinct token. This is because a non-existent hash bucket indicates that the token has a different value from any other token that has been processed. However, if a hash bucket already exists for the token, the token may be flagged as a duplicate token. This is because the hash bucket indicates that the token has the same value as another token that has already been processed.

Provided below is an example of a query that generates an unsorted-encoded table.

```
CREATE TABLE unsorted_encoded_tab as (
  SELECT ENCODE_FIRST (<primary key column>) OVER
    (PARTITION BY <token_column>) as code_unsorted
  ENCODE_FLAG_FIRST OVER
    (PARTITION BY <token_column>) as to_flag,
  <token_column> as token
  rid as id
  FROM decoded_base_tab
```

Generating Unsorted-to-Sorted Table

Figure 3:
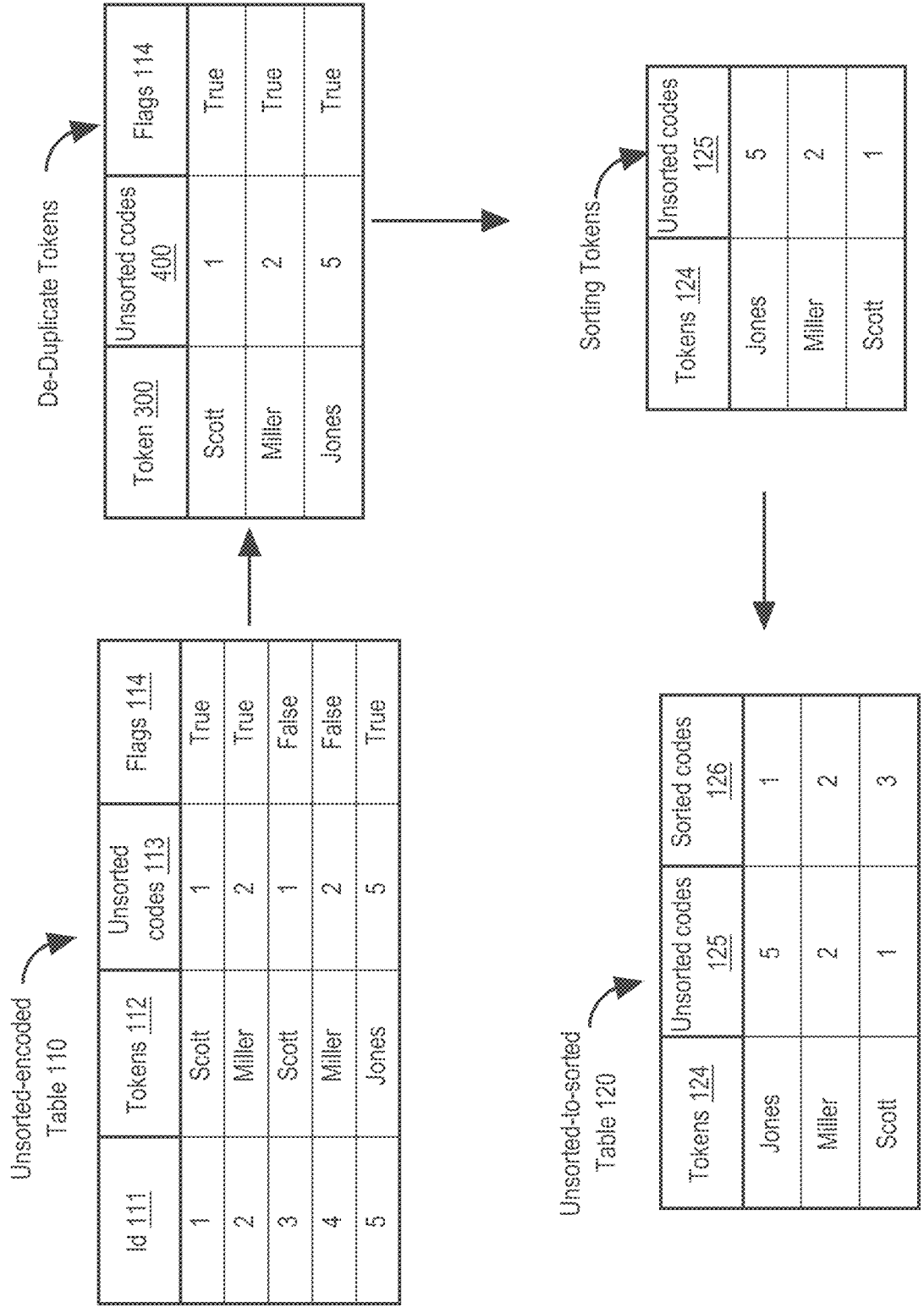
FIG. 3 depicts an example for generating an unsorted to sorted table, which involves de-duplicating tokens, sorting tokens, and assigning codes to tokens, according to an embodiment of the present invention.

FIG. 3 depicts the generation of an unsorted-to-sorted table according to an example database query of Dense Relational Pattern. An unsorted-to-sorted table is a one-to-one mapping that maps an unsorted code (its respective token) to a sorted counter-part code of the unsorted code, as illustrated by unsorted-to-sorted table 120. In unsorted-to-sorted table 120, unsorted codes 5, 2, 1 in column unsorted codes 125 are respectively mapped to sorted counter-part codes 1, 2, 3. Sorted codes 126 reflect the order of tokens in tokens 124. As shown later, the unsorted-to-sorted to sorted table 120 is used to generate the dictionary of sorted codes and to encode column 102 using the encoding of column 102 by unsorted codes of unsorted-encoded table 110. The example database query specifies a sequence of operations comprising (1) de-duplicating tokens, (2) sorting tokens, and (3) assigning sorted codes to unsorted codes.

Set of distinct tokens 300 is generated from column 112 of unencoded-encoded table 112 based on flag values stored in flags 114. For example, this can be achieved using a filter operation. This may involve copying tokens from token 112 into one or more temporary structures without copying any duplicate tokens. In some embodiments, the one or more temporary structures may collectively form a temporary column. The one or more temporary structures may be discarded after unsorted-to-sorted table 120 is generated.

Set of ordered tokens 124 may be generated based on sorting set of distinct tokens 300. For example, this can be achieved using the keywords "ORDER BY". Significantly, generating set of ordered tokens 124 enables generation of unsorted-to-sorted table 120.

Unsorted-to-sorted table 120 is generated based on assigning sorted codes 126 to unsorted codes 125. For example, this can be achieved based on performing the ranking function "RANK ( )" on set of distinct tokens 300. In the example of FIG. 3, the first token "Jones" is assigned a rank of "1", the second token "Miller" is assigned a rank of "2", and the third token "Scott" is assigned a rank of "3".

Advantageously, de-duplicating tokens prior to assigning codes can reduce the cost of assigning codes. This is because avoiding duplicate tokens can reduce the number of tokens on which to perform code assignment. The cost savings increases as the size of set of distinct tokens 300 becomes smaller relative to the size of token 112.

Provided below is an example of a query that generates an unsorted-to-sorted table.

```
CREATE TABLE unsorted_to_sorted_tab as (
SELECT rank ( ) OVER
    (ORDER BY token) as code_sorted, code_unsorted, token
FROM unsorted_encoded_tab
WHERE to_flag = 1)
```

Generating Dictionary Table

Figure 4:
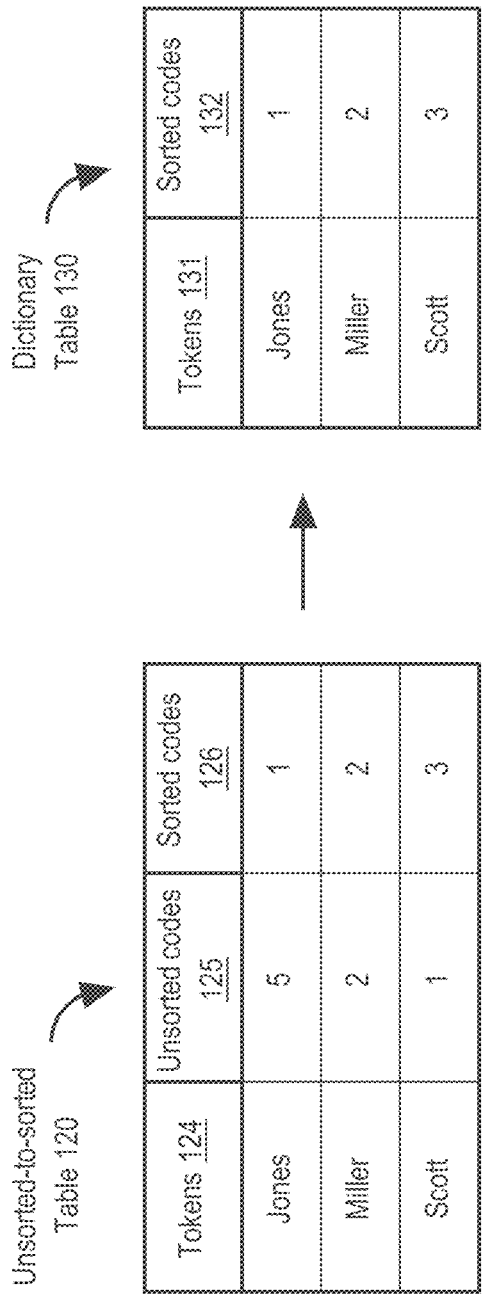
FIG. 4 depicts an example for generating dictionary table, according to an embodiment of the present invention.

FIG. 4 depicts the generation of a dictionary table according to an example database query of Dense Relational Pattern. More specifically, dictionary table 130 is generated based on unsorted-to-sorted table 120 by removing unsorted codes 125.

Provided below is an example of a query that generates a dictionary table.

```
CREATE TABLE dict_tab as (
SELECT code_sorted as code,
    token
FROM unsorted_to_sorted_tab
)
```

Generating Encoded Base Table

Figure 5:
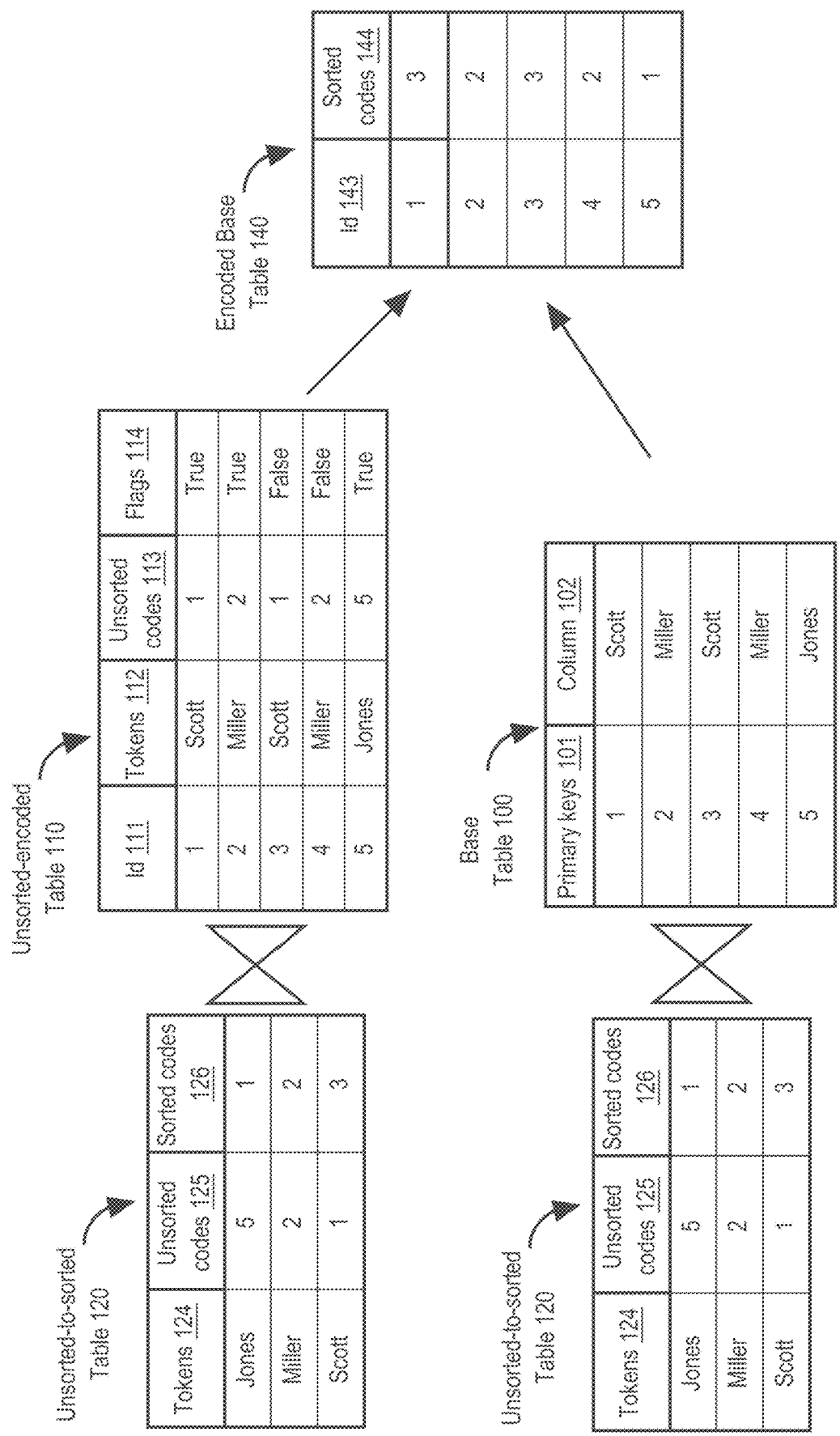
FIG. 5 depicts an example for generating encoded base table, which involves equijoin operations, according to an embodiment of the present invention.

FIG. 5 depicts the generation of an encoded base table according to an example database query of Dense Relational Pattern. An encoded base table is a one-to-one mapping that maps sorted codes to tokens, as illustrated by encoded base table 140. For example, Scott in column 102 of base table 100 is mapped to code 3 in column sorted codes 144 of encoded base table 140. More specifically, encoded base table 140 is generated based on performing an equijoin on unsorted codes 125 of unsorted-to-sorted table 120 and unsorted codes 113 of unsorted-encoded table 110, and an equijoin on sorted codes 126 of unsorted-to-sorted table 120 and primary keys 101 of base table 100.

Provided below is an example of a query that generates an encoded base table.

```
CREATE TABLE encoded_base_tab as (
select b...,
    d.code as string_col
FROM decoded_base_tab b, unsorted_to_sorted_tab d, unsorted_encoded_tab e
WHERE d.code_unsorted = e.code_unsorted and d.id = b.rid;
```

Sorted Relational Pattern

Figure 6A:
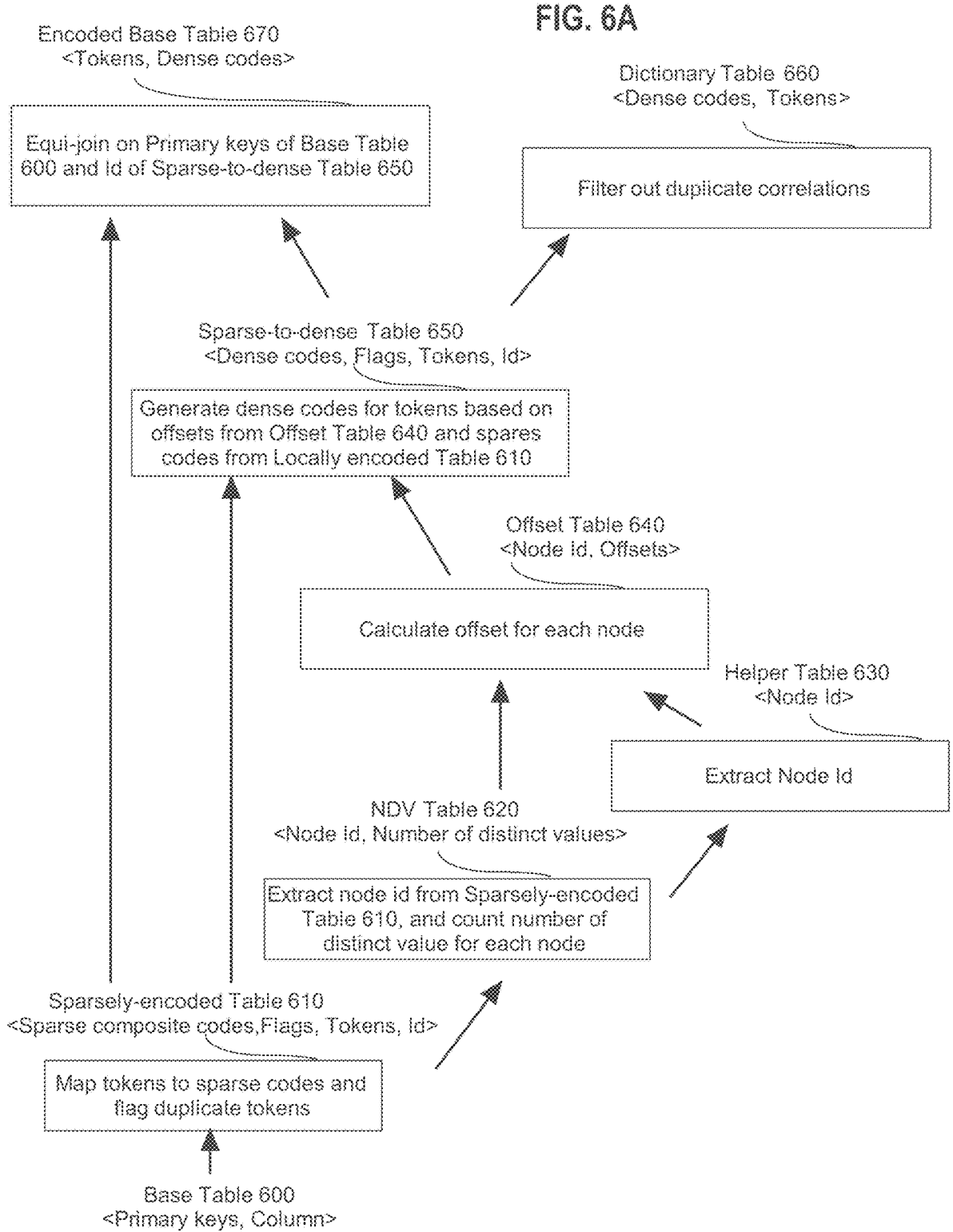

FIG. 6A depicts an example encoding pattern that generates sorted codes, hereinafter referred to as the "Sorted Relational Pattern". Sorted Relational Pattern describes a way of mapping tokens to dense codes. Compared to Dense Relational Pattern, Sorted Relational Pattern involves performing encoding operation in a multi-node DBMS. In some embodiments, Sorted Relational Pattern involves seven database queries: one that generates a sparsely-encoded table, one that generates a NDV table based on the sparsely encoded table, one that generates a helper table based on the NDV table, one the generates an offset table based on the NDV table and the helper table, one that generates a sparse-to-dense table based on the offset table and the sparsely encoded table, and one that generates an encoded base table based on the sparse-to-dense table and the base table. FIG. 6B provides an example of queries for Sorted Relational Pattern.

Generating Sparsely-Encoded Table

Figure 7:
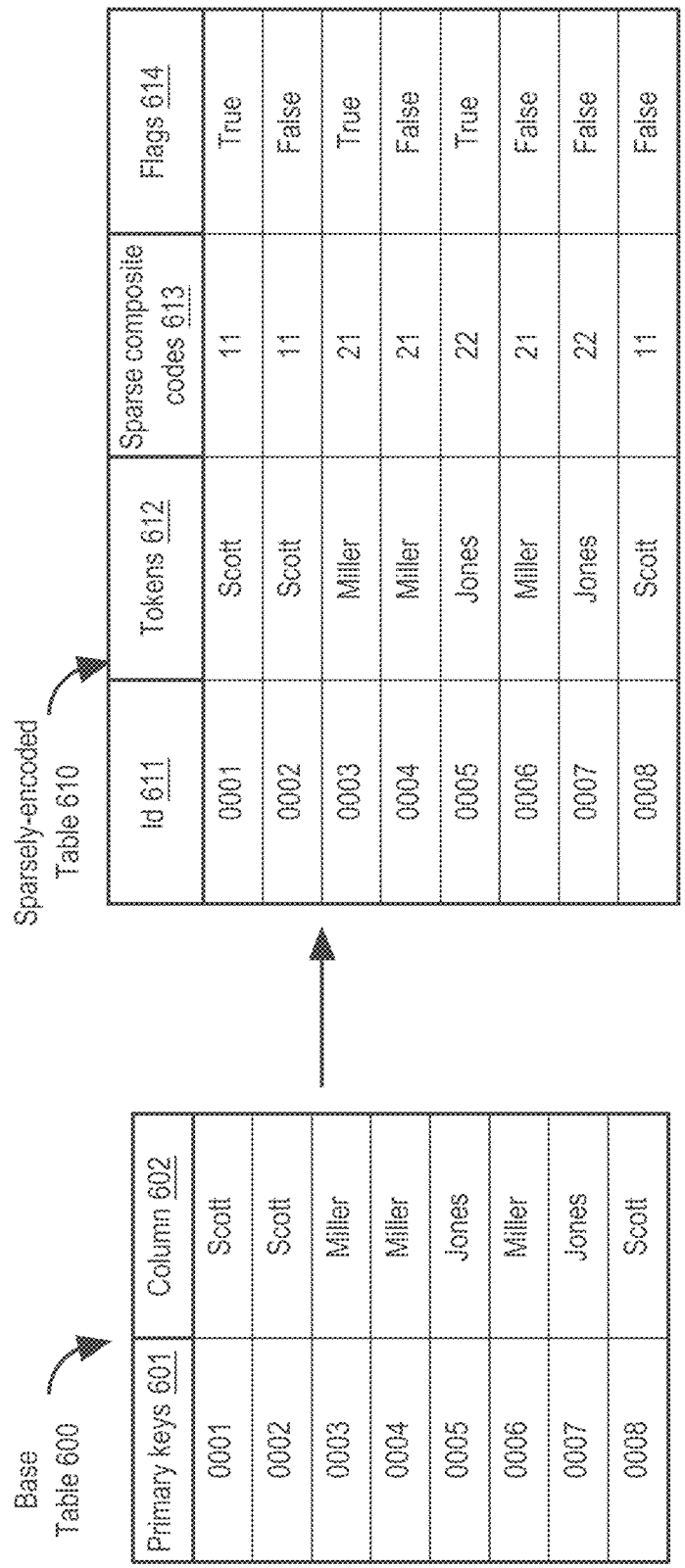
FIG. 7 depicts an example for generating a sparsely encoded table, which involves mapping codes to tokens and flagging any duplicate tokens, according to an embodiment of the present invention.

FIG. 7 depicts the generation of a sparsely encoded table according to an example database query of Sorted Relational Pattern. The sparsely-encoded table in effect encodes the column 602 by sparse composite codes 613, where each sparse composite code comprises a node identifier identifying a particular process/node and a local code identifying a distinct token processed at the particular process/node. In sparsely-encoded table 610, tokens Scott, Miller, Jones are respectively mapped to sparse counter-part sparse composite codes 11, 21, 22. The database query specifies a sequence of operations comprising (1) mapping tokens to codes, wherein each code including a counter corresponding to a distinct token of plurality of tokens and a node identifier identifying a node of multi-node DBMS, (2) generating flags to indicate whether or not a particular token is the first value of a set of one or more identical values.

For example, assigning sparse composite codes 613 to tokens 602 can be achieved applying an ENCODE_SPARSE_CODE ( ) operator. Referring to FIG. 7, ENCODE_SPARSE_CODE ( ) generates codes 613.

Referring to FIG. 7, column 602 stores a set of tokens 612, each token being stored in a separate row/as a separate element of column 602. The database table comprising column 600 also has a column, virtual or otherwise, of primary keys. As used herein, a primary key refers to any information that can be used to uniquely identify a row. In the example of FIG. 7, the primary keys are primary keys 601.

In general, ENCODE_SPARSE_CODE generates unique sparse composite codes to use as dictionary codes. More specifically, each unique sparse composite code comprises a node identifier identifying a particular process/node and a local code identifying a distinct token processed at the particular process/node. For example, the most significant bits may be reserved for a node identifier, and the least significant bits may be reserved for a local code that is incremented for each distinct token processed at a particular node. Advantageously, such identifiers can be represented using a relatively small number of bits.

Example inputs and outputs involved in performing ENCODE_SPARSE_CODE are depicted in FIG. 7. For the sake of clarity and ease of explanation, FIG. 7 depicts the reduction in the number of bits as a reduction in the number of digits. Thus, each of primary keys 601 is represented using four digits, whereas each of sparse composite codes 613 is represented using two digits.

The first digit of each of sparse composite codes 613 identifies a particular process/node. Notably, tokens having identical values are distributed to the same process/node. For example, the first digit of the code "11" indicates that each "Scott" token is processed at Node 1, whereas the first digit of the code "21" indicates that each "Miller" token is processed at Node 2.

The second digit of each of sparse composite codes 613 identifies a distinct token that is distributed to the particular process/node identified by the first digit. Since tokens having identical values are distributed to the same process/node, such tokens have the same second digit in the example of FIG. 7. For example, the first digits of the codes "21" and "22" respectively indicate that each "Miller" token and each "Jones" token is processed at Node 2; however, the second digits indicate that the "Miller" tokens are distinct from the "Jones" tokens. As mentioned above, the second digit can be thought of as a counter that is local to a process/node. At each process/node, a counter may have an initial value, such as one, that is incremented whenever a distinct token is processed.

Notably, ENCODE_SPARSE_CODE involves partitioning a set of tokens across a plurality of processes/nodes. However, synchronization can be avoided based on randomly distributing the set of tokens across the plurality of processes/nodes. For example, hash partitioning may be used to achieve a random distribution. With hash partitioning, a token is hashed to determine where it is to be processed, thereby ensuring that tokens having identical values are distributed to the same process/node. However, without synchronization, a roughly even distribution is difficult to achieve.

Generating flags 614 to indicate whether a respective unsorted code is a first occurrence of said unsorted code can be achieved applying an ENCODE_FLAG_FIRST ( ) operator. Referring to FIG. 7, ENCODE_FLAG_FIRST generates flags 614.

For example, the "Scott" token in Row 1 is flagged as "True", because it is the first "Scott" to processed. However, the "Scott" token in Row 2 is flagged as "False", because it is not the first "Scott" to be processed. However, it should be appreciated that flags 614 may be implemented using bit flags or any other set of two or more indicators for distinguishing between distinctness and non-distinctness.

In some embodiments, flags are determined based on references to a hash table. For example, a token may be hashed, and if a hash bucket does not already exist for the token, a hash bucket may be created, and the token may be flagged as a distinct token. This is because a non-existent hash bucket indicates that the token has a different value from any other token that has been processed. However, if a hash bucket already exists for the token, the token may be flagged as a duplicate token. This is because the hash bucket indicates that the token has the same value as another token that has already been processed.

Provided below is an example of a query that generates a sparsely-encoded table.

```
CREATE TABLE sparsely_encoded_tab as (
    SELECT ENCODE_SPARSE_CODE ( ) OVER
        (PARTITION BY <token_column>) as code_sparse
    ENCODE_FLAG_FIRST OVER
        (PARTITION BY <token_column>) as to_flag,
    <token_column> as token
    rid as id
FROM decoded_base_tab
```

Generating NDV Table

FIG. 8A depicts the generation of an NDV table according to an example database query of Sorted Relational Pattern. An NDV table provides the number of distinct tokens for each node. As mentioned above, each token is mapped to a sparse composite code, where each sparse composite code comprises a node identifier identifying a particular process/node and a local code identifying a distinct token processed at the particular process/node. Although different tokens from different nodes are mapped to unique sparse composite codes, different tokens from different nodes can be mapped to a same local code. As shown in FIG. 8A, token "Scott" is mapped to sparse composite code "11" and token "Miller" is mapped to sparse composite code "21". Both "Scott" and "Miller" are mapped to the same local code "1". To transmit sparse composite codes to dense codes, increasing "local" offset values are each assigned to node be added or subtracted to local codes to form unique codes across all tokens from all nodes. As shown in later, the NDV table is used to generate local offsets for each node in offset table.

FIG. 8B provides an example of NDV table. In FIG. 8B, column Node Id 701 identifies processes/nodes, and column Number of distinct values 702 identifies the number of distinct tokens processed at the corresponding process/node. As shown in NDV table 700, node 1 has 100 distinct tokens, node 2 has 200 distinct tokens, node 4 has 300 distinct tokens, and node 5 has 100 distinct tokens.

More specifically, NDV table 620 is generated based on extracting node identifiers from sparse composite codes 613 and counting the number of distinct tokens of each node.

Extracting node identifiers can be achieved based on performing the extracting function "EXTRACT ( )" on set of sparse composite codes 613. In the example of FIG. 8A, the first digit of sparse composite code 613 indicates that set of tokens 612 are from node 1 and node 2.

Counting the number of distinct tokens of each node can be achieved based on performing function "max ( )" on counters after counters for each node has been extracted from sparse composite code 613. In the example of FIG. 8A, the second digit of sparse composite code 613 indicates counter values. The maximum counter value for node 1 is "1", which indicates there is one distinct token from node 1. The maximum counter value for node 2 is "2", which indicates there are two distinct tokens from node 2.

Provided below is an example of a query that generates an NDV table.

```
CREATE TABLE ndv_tab AS (
SELECT EXTRACT (ENCODING_SITE FROM code_sparse) as node_id.
    max (EXTRACT (LOCAL_CODE FROM code_sparse)) as ndv
FROM sparsely_encoded_tab
GROUP BY EXTRACT (ENCODING_SITE FROM code_sparse))
```

Generating Helper Table

Figure 9:
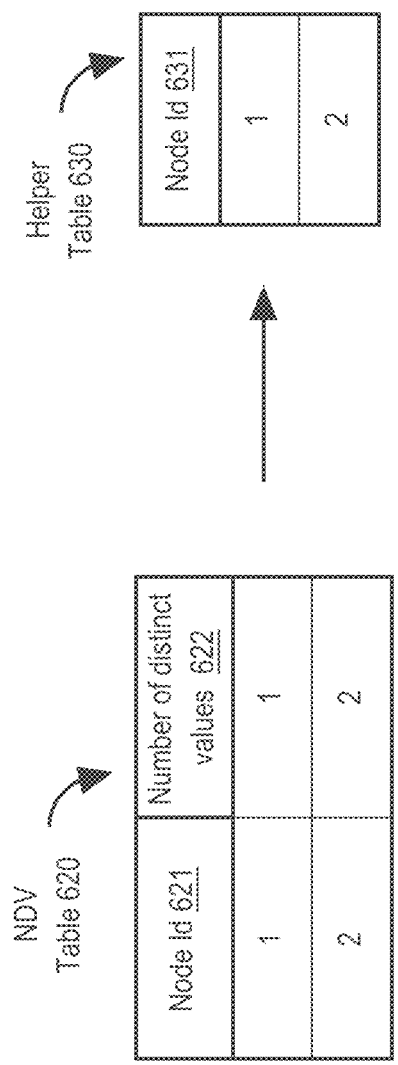
FIG. 9 depicts an example for generating a helper table, according to an embodiment of the present invention.

FIG. 9 depicts the generation of a helper table according to an example database query of Sorted Relational Pattern. More specifically, helper table 630 is generated based on NDV table 620 by removing number of distinct values 622.

Provided below is an example of a query that generates a helper table.

```
CREATE TABLE encode_node_helper AS (
SELECT node_id
FROM ndv _tab)
```

Generating Offset Table

Figure 10A:
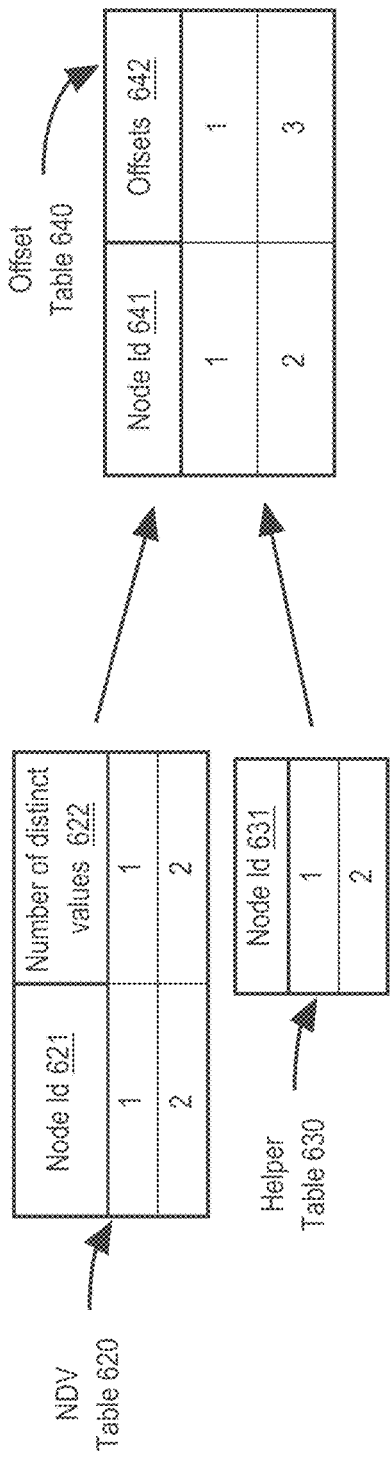
FIG. 10A-B depict examples for generating an offset table, according to an embodiment of the present invention.
Figure 10B:
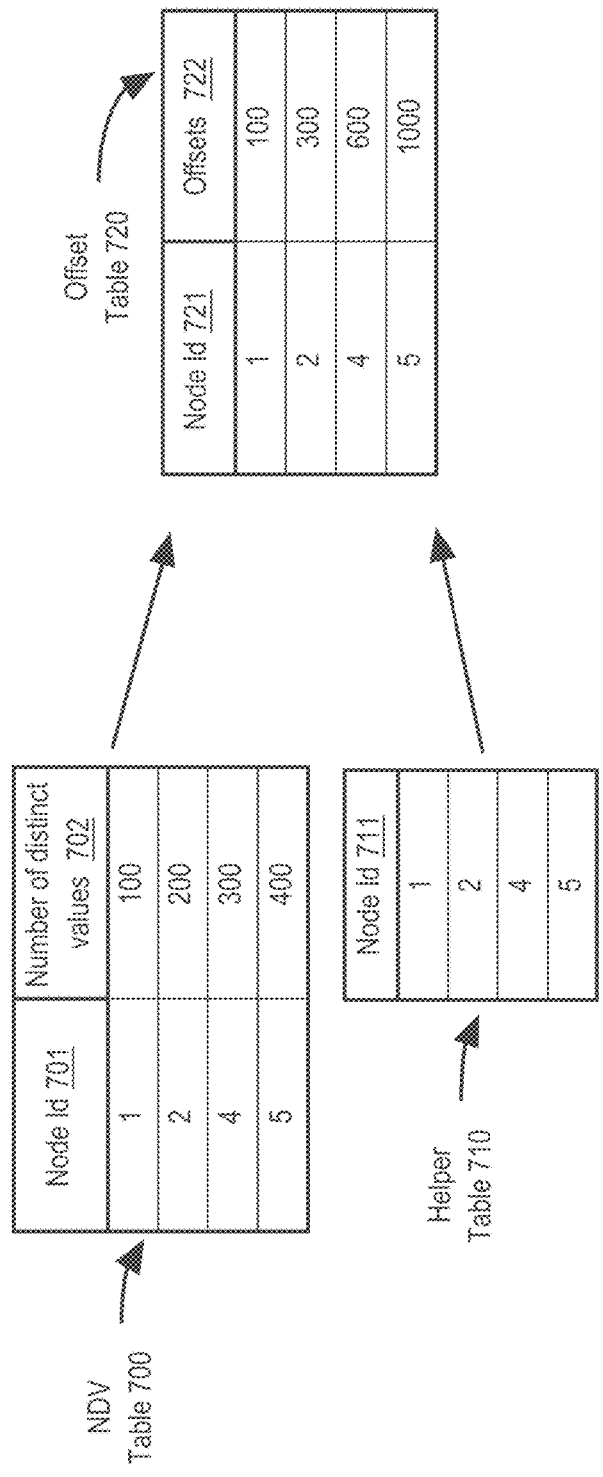

FIG. 10B depicts the generation of offset table according to an example database query of Sorted Relational Pattern. The offset table 720 provides local offsets for each process/node. As mentioned above, sparsely-encoded table generates sparse composite codes for tokens from different process/node. To reduce storage, in the dictionary and the data encoded by the codes, local offsets are generated to be used to generate dense codes.

More specifically, offsets 722 of offset table 720 is calculated based on number of distinct values 702 of NDV table 700. For example, this can be achieved based on performing the function "SUM ( )" on number of distinct values, where the offset value for each node is the summation of the number of distinct values in previous nodes and the number of distinct values in current node. In the example of FIG. 10B, the offset value for node 4 is "600", which is calculated by adding the number of distinct values of node 1, node 2, and node 4. Similarly, the offset value of node 5 is "1000", which is calculated by adding the number of distinct values of node 1, node 2, node 4, and node 5. FIG. 10A provides another example of generating the offset table. In the example of FIG. 10A, the offset value for node 2 is "3", which is calculated by adding the number of distinct values of node 1 and the number of distinct values of node 2.

Provided below is an example of a query that generates an offset table.

```
CREATE TABLE encode _offest_tab AS (
SELECT SUM (s.ndv) as offset, h.node_id
WHERE s. node_id <= h. node_id
GROUP by h. node_id)
```

Generating Sparse-to-Dense Table

Figure 11:
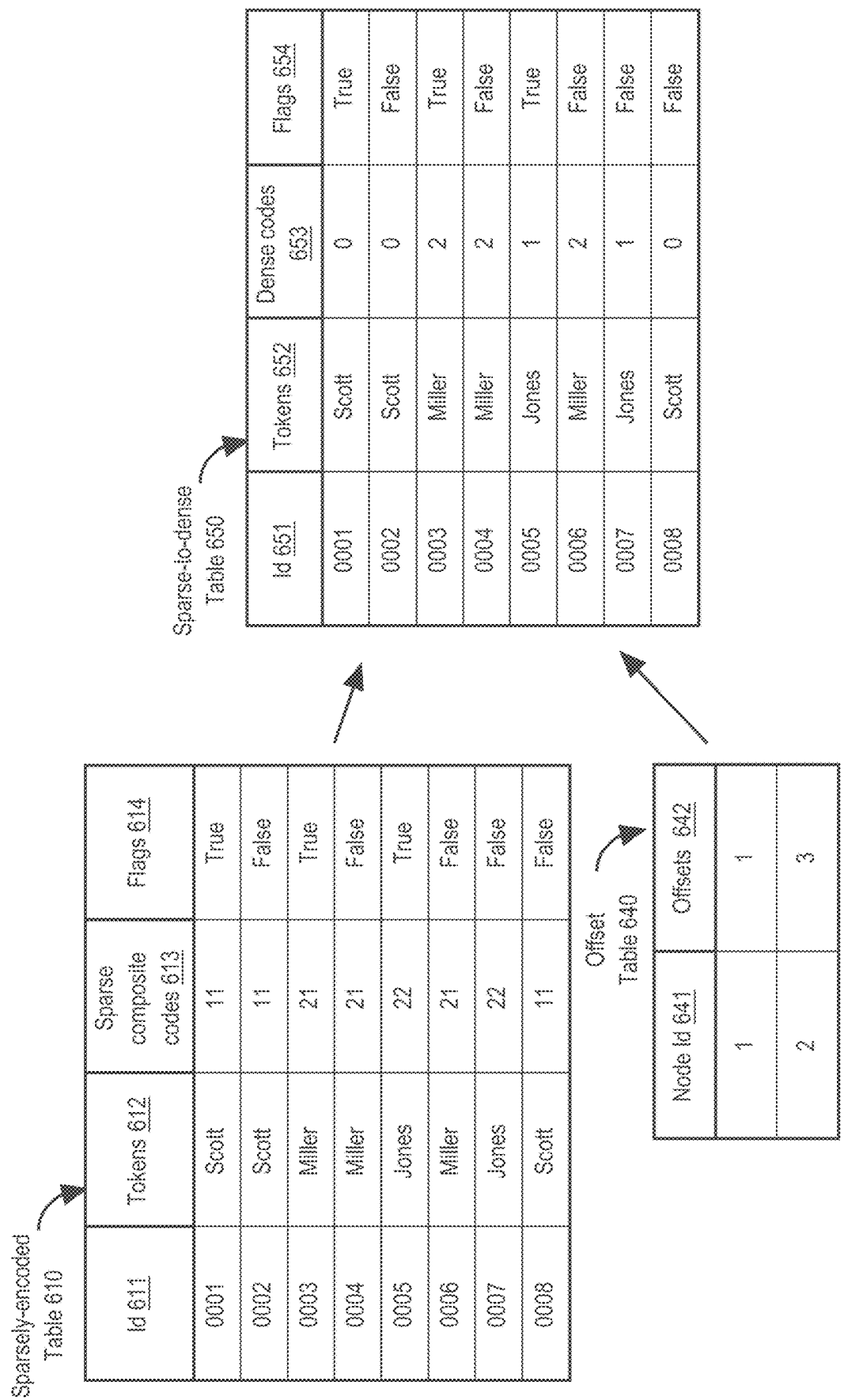
FIG. 11 depicts an example for generating a sparse to dense table, according to an embodiment of the present invention.

FIG. 11 depicts the generation of a sparse-to-dense table according to an example database query of Sorted Relational Pattern. A sparse-to-dense table is a one-to-one mapping that makes maps a sparse composite code (its respective token) to a dense counter-part code of the sparse-code. In FIG. 11, sparse composite code 11 (token Scott), 21 (token Miller), 22 (token Jones) are respectively mapped to dense counter-part codes 0, 2, 1.

More specifically, dense codes 653 of sparse to dense table 650 is calculated based on offsets 642 of offset table 640 and sparse composite codes 613 of sparsely encoded table 610. For example, dense codes 653 is calculated by using offsets 642 minus counter values, which is extracted from sparse composite codes 613. In the example of FIG. 11, the first token "Scott" is mapped to a sparse composite code of "11", which indicates token "Scott" is from node 1 and has a counter value of "1". The offset value for node 1 is "1". The dense code value of "Scott" is "0", which is calculated by using offset value "1" minus counter value "1".

Provided below is an example of a query that generates a sparse-to-dense table.

```
CREATE TABLE sparse_to_dense_tab AS (
SELECT g.offset - EXTRACT (LOCAL_CODE FROM code_sparse) as code_dense,
    to_flag,
    token,
    id
FROM encode_offset_tab g, sparsely_encoded_tab e
WHERE g.node_ID = EXTRACT (ENCODING_SITE FROM code_sparse))
```

Generating Dictionary Table

Figure 12:
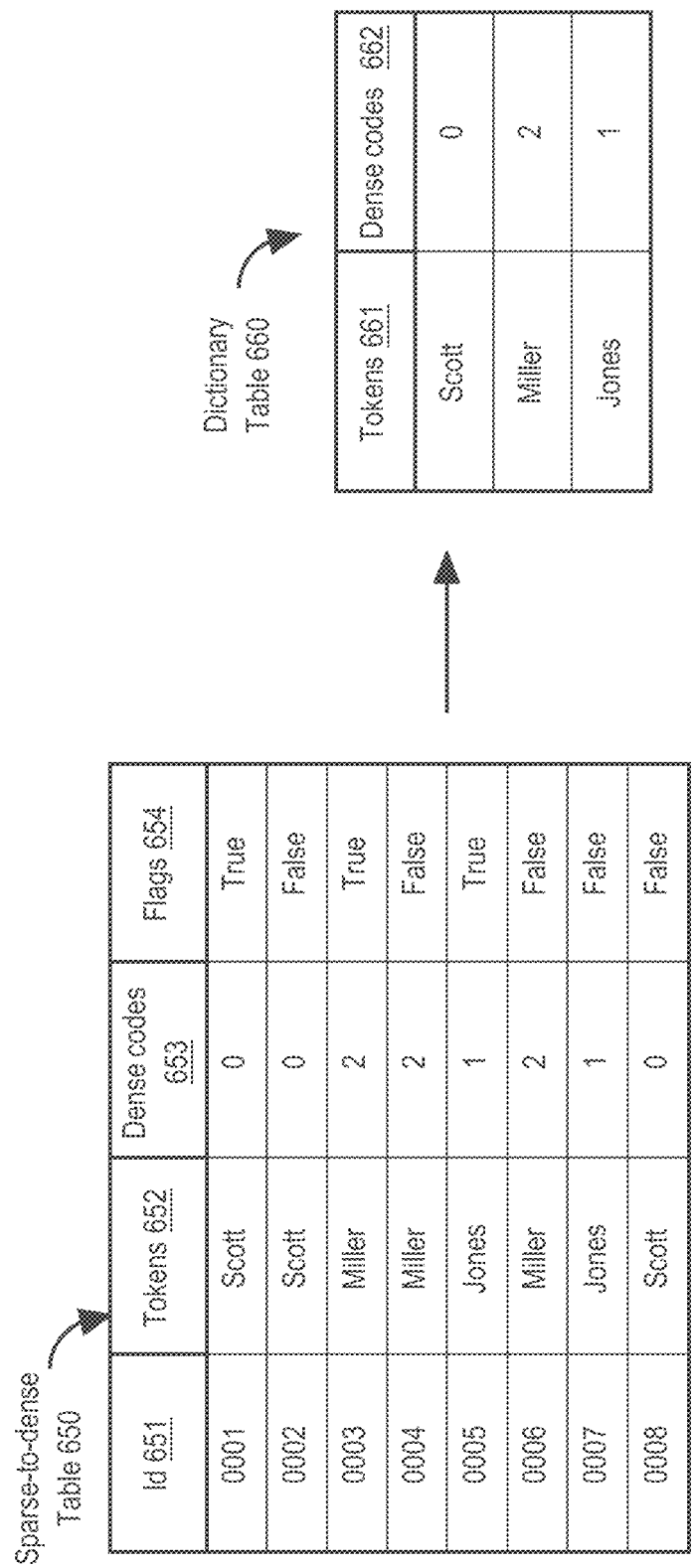
FIG. 12 depicts an example for generating a dictionary table, which involves de-duplicating any duplicate correlations, according to an embodiment of the present invention.

FIG. 12 depicts the generation of a dictionary table according to an example database query of Sorted Relational Pattern. More specifically, dictionary table 660 is generated based on sparse-to-dense table 650 by filtering out duplicate correlations.

Provided below is an example of a query that generates a dictionary table.

```
CREATE TABLE dict_tab as (
SELECT code_dense as code,
    token
FROM sparse_to_dense_tab
WHERE to_flag =1)
```

Generating Encoded Base Table

Figure 13:
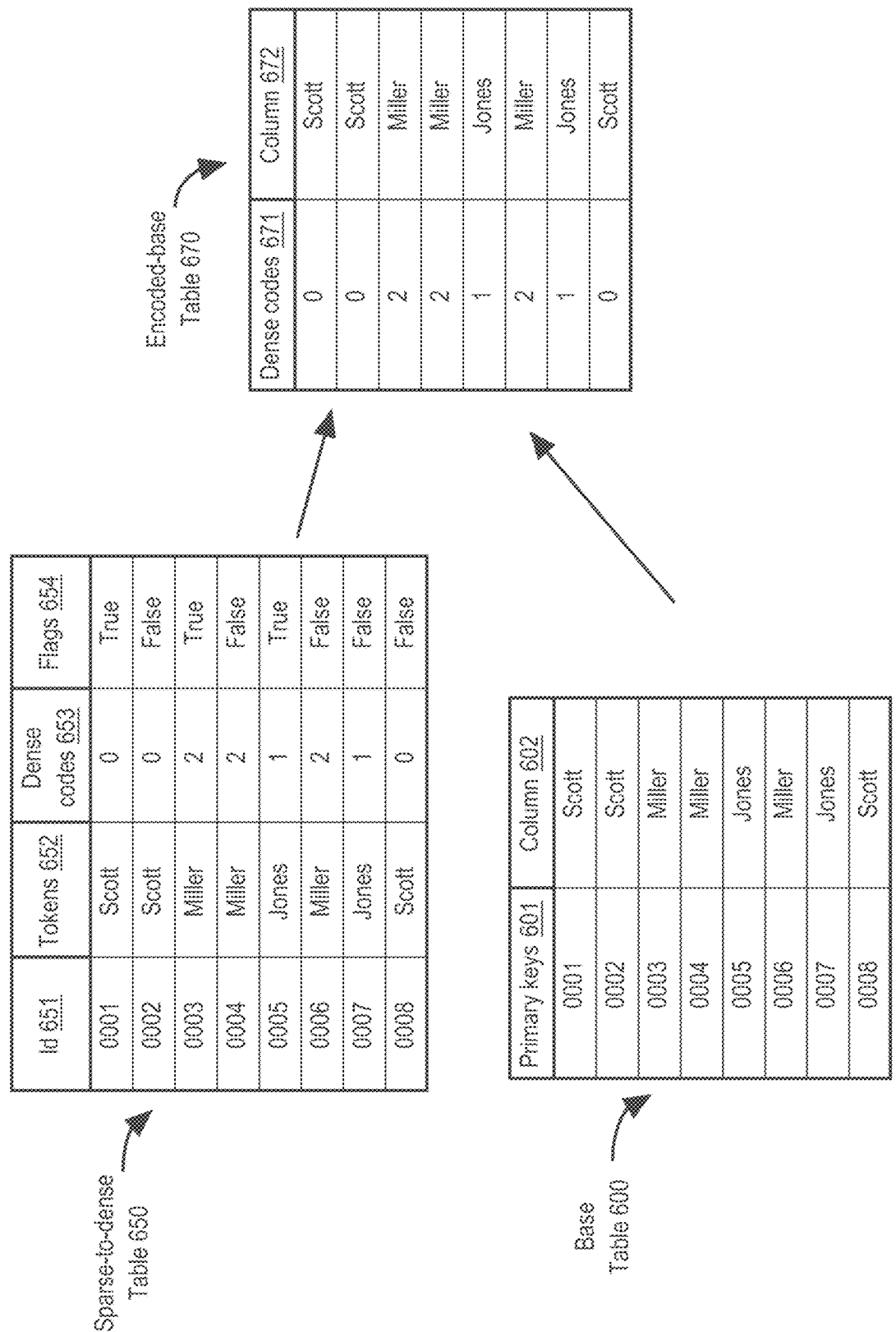
FIG. 13 depicts an example for generating an encoded base table, which involves equip-join operation, according to an embodiment of the present invention.

FIG. 13 depicts the generation of an encoded base table according to an example database query of Sorted Relational Pattern. More specifically, encoded base table 670 is generated based on performing an equijoin on primary keys 601 of base table 600 and Id 651 of sparse-to-dense table 650.

Provided below is an example of a query that generates an encoded base table.

```
CREATE TABLE encoded_base_tab as (
select b...,
    d.code as string_col
FROM decoded_base_tab b,sparse_to_dense_tab d
WHERE b.rid = d.id;
```

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 14:
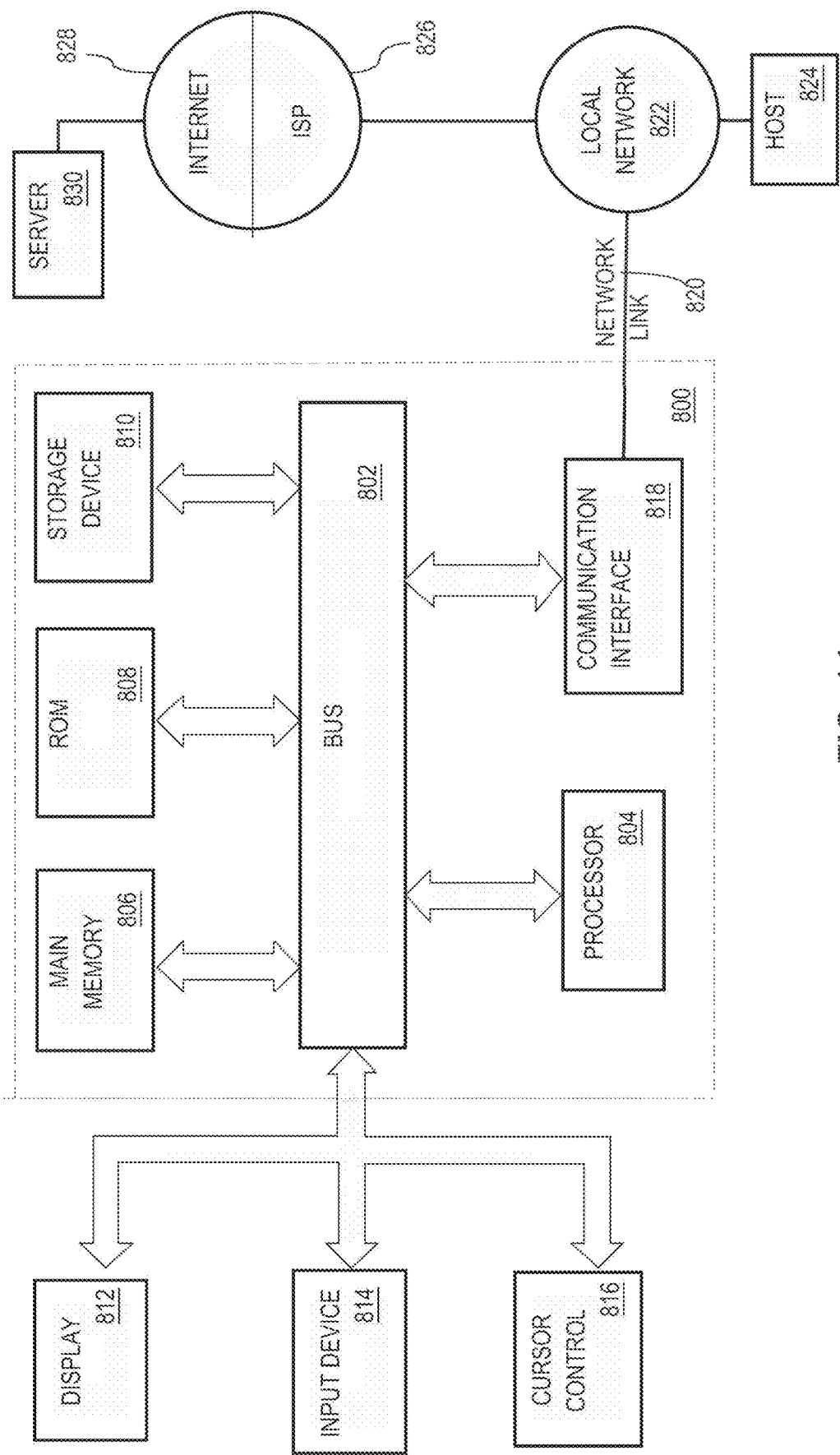
FIG. 14 depicts an example for generating a computer system upon which embodiments may be implemented, according to an embodiment of the present invention.

For example, FIG. 14 is a block diagram that illustrates a computer system 800 upon which an embodiment of the disclosure may be implemented. Computer system 800 includes a bus 802 or other communication mechanism for communicating information, and a hardware processor 804 coupled with bus 802 for processing information. Hardware processor 804 may be, for example, a general-purpose microprocessor.

Computer system 800 also includes a main memory 806, such as a random-access memory (RAM) or other dynamic storage device, coupled to bus 802 for storing information and instructions to be executed by processor 804. Main memory 806 also may be used for storing temporary variables or other intermediate information during execution of instructions to be executed by processor 804. Such instructions, when stored in non-transitory storage media accessible to processor 804, render computer system 800 into a special-purpose machine that is customized to perform the operations specified in the instructions.

Computer system 800 further includes a read only memory (ROM) 808 or other static storage device coupled to bus 802 for storing static information and instructions for processor 804. A storage device 810, such as a magnetic disk, optical disk, or solid-state drive is provided and coupled to bus 802 for storing information and instructions.

Computer system 800 may be coupled via bus 802 to a display 812, such as a cathode ray tube (CRT), for displaying information to a computer user. An input device 814, including alphanumeric and other keys, is coupled to bus 802 for communicating information and command selections to processor 804. Another type of user input device is cursor control 816, such as a mouse, a trackball, or cursor direction keys for communicating direction information and command selections to processor 804 and for controlling cursor movement on display 812. This input device has two degrees of freedom in two axes, a first axis (e.g., x) and a second axis (e.g., y), that allows the device to specify positions in a plane.

Computer system 800 may implement the techniques described herein using customized hard-wired logic, one or more ASICs or FPGAs, firmware and/or program logic which in combination with the computer system causes or programs computer system 800 to be a special-purpose machine. According to one embodiment, the techniques herein are performed by computer system 800 in response to processor 804 executing one or more sequences of one or more instructions contained in main memory 806. Such instructions may be read into main memory 806 from another storage medium, such as storage device 810. Execution of the sequences of instructions contained in main memory 806 causes processor 804 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 810. Volatile media includes dynamic memory, such as main memory 806. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 802. Transmission media can also take the form of acoustic or light waves, such as those generated during radio-wave and infra-red data communications.

Various forms of media may be involved in carrying one or more sequences of one or more instructions to processor 804 for execution. For example, the instructions may initially be carried on a magnetic disk or solid-state drive of a remote computer. The remote computer can load the instructions into its dynamic memory and send the instructions over a telephone line using a modem. A modem local to computer system 800 can receive the data on the telephone line and use an infra-red transmitter to convert the data to an infra-red signal. An infra-red detector can receive the data carried in the infra-red signal and appropriate circuitry can place the data on bus 802. Bus 802 carries the data to main memory 806, from which processor 804 retrieves and executes the instructions. The instructions received by main memory 806 may optionally be stored on storage device 810 either before or after execution by processor 804.

Computer system 800 also includes a communication interface 818 coupled to bus 802. Communication interface 818 provides a two-way data communication coupling to a network link 820 that is connected to a local network 822. For example, communication interface 818 may be an integrated service digital network (ISDN) card, cable modem, satellite modem, or a modem to provide a data communication connection to a corresponding type of telephone line. As another example, communication interface 818 may be a local area network (LAN) card to provide a data communication connection to a compatible LAN. Wireless links may also be implemented. In any such implementation, communication interface 818 sends and receives electrical, electromagnetic or optical signals that carry digital data streams representing various types of information.

Network link 820 provides data communication through one or more networks to other data devices. For example, network link 820 may provide a connection through local network 822 to a host computer 824 or to data equipment operated by an Internet Service Provider (ISP) 826. ISP 826 in turn provides data communication services through the world-wide packet data communication network now commonly referred to as the "Internet" 828. Local network 822 and Internet 828 both use electrical, electromagnetic or optical signals that carry digital data streams. The signals through the various networks and the signals on network link 820 and through communication interface 818, which carry the digital data to and from computer system 800, are example forms of transmission media.

Computer system 800 can send messages and receive data, including program code, through the network(s), network link 820 and communication interface 818. In the Internet example, a server 830 might transmit a requested code for an application program through Internet 828, ISP 826, local network 822 and communication interface 818.

The received code may be executed by processor 804 as it is received, and/or stored in storage device 810, or other non-volatile storage for later execution.

Software Overview

Figure 15:
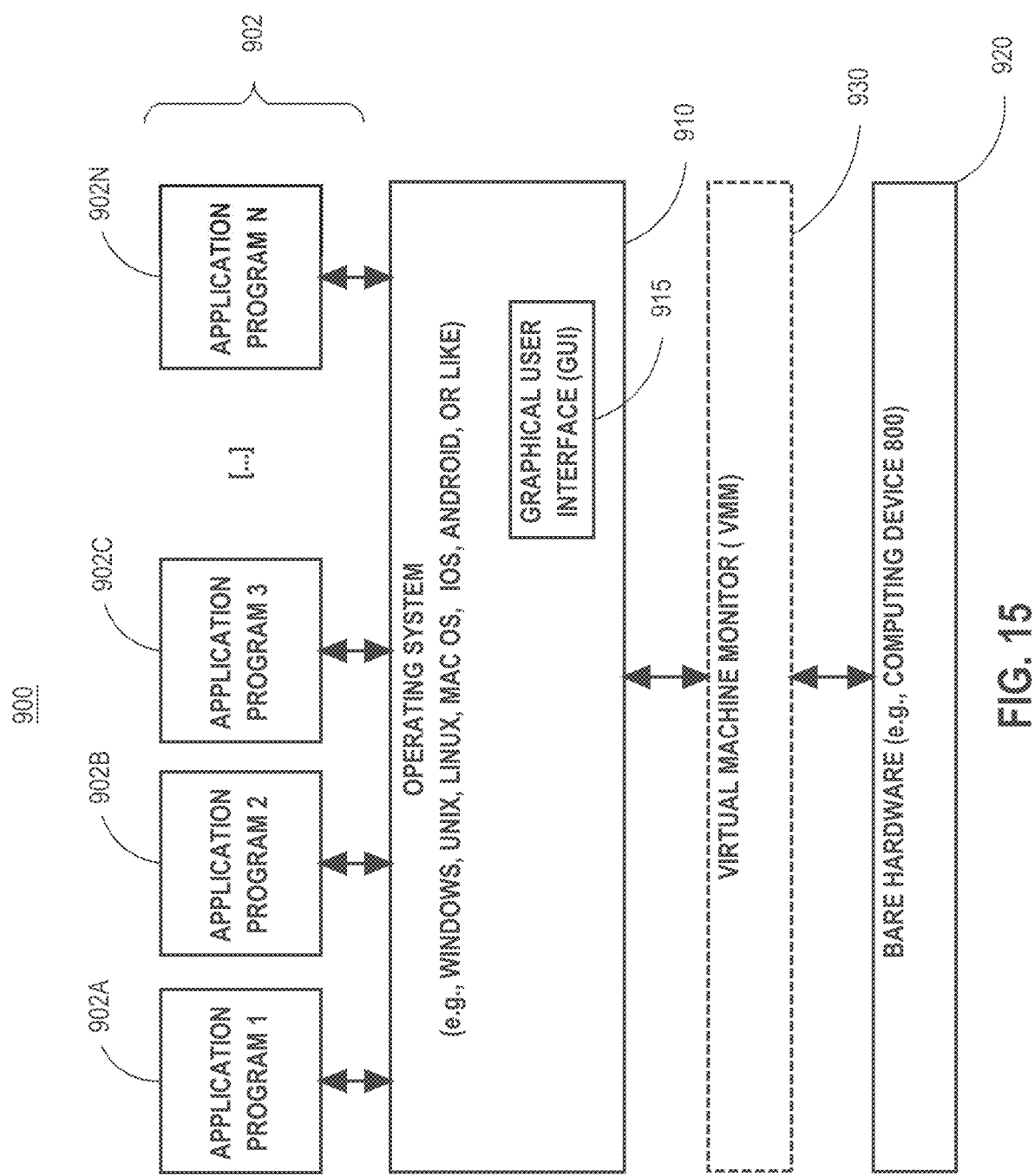
FIG. 15 depicts a software system for controlling the operation of the computer system, according to an embodiment of the present invention.

FIG. 15 is a block diagram of a software system 900 that may be employed for controlling the operation of computer system 800. Software system 900 and its components, including their connections, relationships, and functions, is meant to be exemplary only, and not meant to limit implementations of the example embodiment(s). Other software systems suitable for implementing the example embodiment(s) may have different components, including components with different connections, relationships, and functions.

Software system 900 is provided for directing the operation of computer system 800. Software system 900, which may be stored in system memory (RAM) 806 and on fixed storage (e.g., hard disk or flash memory) 810, includes a kernel or operating system (OS) 910.

The OS 910 manages low-level aspects of computer operation, including managing execution of processes, memory allocation, file input and output (I/O), and device I/O. One or more application programs, represented as 902A, 902B, 902C . . . 902N, may be "loaded" (e.g., transferred from fixed storage 810 into memory 806) for execution by the system 800. The applications or other software intended for use on system 800 may also be stored as a set of downloadable computer-executable instructions, for example, for downloading and installation from an Internet location (e.g., a Web server, an app store, or other online service).

Software system 900 includes a graphical user interface (GUI) 915, for receiving user commands and data in a graphical (e.g., "point-and-click" or "touch gesture") fashion. These inputs, in turn, may be acted upon by the system 900 in accordance with instructions from operating system 910 and/or application(s) 902. The GUI 915 also serves to display the results of operation from the OS 910 and application(s) 902, whereupon the user may supply additional inputs or terminate the session (e.g., log off).

OS 910 can execute directly on the bare hardware 920 (e.g., processor(s) 804) of system 900. Alternatively, a hypervisor or virtual machine monitor (VMM) 930 may be interposed between the bare hardware 920 and the OS 910. In this configuration, VMM 930 acts as a software "cushion" or virtualization layer between the OS 910 and the bare hardware 920 of the system 800.

VMM 930 instantiates and runs one or more virtual machine instances ("guest machines"). Each guest machine comprises a "guest" operating system, such as OS 910, and one or more applications, such as application(s) 902, designed to execute on the guest operating system. The VMM 930 presents the guest operating systems with a virtual operating platform and manages the execution of the guest operating systems.

In some instances, the VMM 930 may allow a guest operating system to run as if it is running on the bare hardware 920 of system 800 directly. In these instances, the same version of the guest operating system configured to execute on the bare hardware 920 directly may also execute on VMM 930 without modification or reconfiguration. In other words, VMM 930 may provide full hardware and CPU virtualization to a guest operating system in some instances.

In other instances, a guest operating system may be specially designed or configured to execute on VMM 930 for efficiency. In these instances, the guest operating system is "aware" that it executes on a virtual machine monitor. In other words, VMM 930 may provide para-virtualization to a guest operating system in some instances.

The above-described basic computer hardware and software is presented for purpose of illustrating the basic underlying computer components that may be employed for implementing the example embodiment(s). The example embodiment(s), however, are not necessarily limited to any particular computing environment or computing device configuration. Instead, the example embodiment(s) may be implemented in any type of system architecture or processing environment that one skilled in the art, in light of this disclosure, would understand as capable of supporting the features and functions of the example embodiment(s) presented herein.

Cloud Computing

The term "cloud computing" is generally used herein to describe a computing model which enables on-demand access to a shared pool of computing resources, such as computer networks, servers, software applications, and services, and which allows for rapid provisioning and release of resources with minimal management effort or service provider interaction.

A cloud computing environment (sometimes referred to as a cloud environment, or a cloud) can be implemented in a variety of different ways to best suit different requirements. For example, in a public cloud environment, the underlying computing infrastructure is owned by an organization that makes its cloud services available to other organizations or to the general public. In contrast, a private cloud environment is generally intended solely for use by, or within, a single organization. A community cloud is intended to be shared by several organizations within a community; while a hybrid cloud comprises two or more types of cloud (e.g., private, community, or public) that are bound together by data and application portability.

Generally, a cloud computing model enables some of those responsibilities which previously may have been provided by an organization's own information technology department, to instead be delivered as service layers within a cloud environment, for use by consumers (either within or external to the organization, according to the cloud's public/ private nature). Depending on the particular implementation, the precise definition of components or features provided by or within each cloud service layer can vary, but common examples include: Software as a Service (SaaS), in which consumers use software applications that are running upon a cloud infrastructure, while a SaaS provider manages or controls the underlying cloud infrastructure and applications. Platform as a Service (PaaS), in which consumers can use software programming languages and development tools supported by a PaaS provider to develop, deploy, and otherwise control their own applications, while the PaaS provider manages or controls other aspects of the cloud environment (i.e., everything below the run-time execution environment). Infrastructure as a Service (IaaS), in which consumers can deploy and run arbitrary software applications, and/or provision processing, storage, networks, and other fundamental computing resources, while an IaaS provider manages or controls the underlying physical cloud infrastructure (i.e., everything below the operating system layer). Database as a Service (DBaaS) in which consumers use a database server or Database Management System that is running upon a cloud infrastructure, while a DBaaS provider manages or controls the underlying cloud infrastructure, applications, and servers, including one or more database servers.

EXTENSIONS AND ALTERNATIVES

In the foregoing specification, embodiments of the disclosure have been described with reference to numerous specific details that may vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction.

What is claimed is:

1. A method for encoding a base table, the method comprising:
executing a first database statement that specifies to create an unsorted-encoded table from a base table that contains a token column wherein executing said first database statement causes generating said unsorted-encoded table, wherein said token column contains a plurality of tokens that includes a plurality of distinct tokens, wherein said unsorted-encoded table maps a plurality of unsorted codes to said plurality of distinct tokens, wherein said plurality of unsorted codes do not reflect an order of said plurality of distinct tokens, wherein each unsorted code of said plurality of unsorted codes is mapped by said unsorted-encoded table to a respective distinct token of said plurality of distinct tokens;
executing a second database statement that specifies to create an unsorted-to-sorted table that maps said plurality of unsorted codes to a plurality of sorted codes, wherein executing said second database statement causes generating said unsorted-to-sorted table, wherein each unsorted code of said plurality of unsorted codes is mapped by said unsorted-to-sorted table to a sorted code of said plurality of sorted codes that reflects the order of the respective distinct token of said each unsorted code among the plurality of distinct tokens;
based on the unsorted-to-sorted table, generating a dictionary table, wherein each sorted code of said plurality of sorted codes is mapped by said dictionary table to a respective distinct token of said plurality of distinct tokens; and
encoding the token column based on the dictionary table.

2. The method of claim 1, wherein the first database statement applies a first encode operator to said token column, wherein said first encode operator generates a distinct code for each distinct token.

3. The method of claim 2, wherein the first database statement applies a second encode operator to said token column, wherein said second encode operator stores, in a flag column of said unsorted-encode table, flags that each indicate whether a respective unsorted code is a first occurrence of said respective unsorted code.

4. The method of claim 3, the method further including executing a particular database statement that causes:
removing duplicates by filtering on said flag column; and
for each row of said unsorted-to-sorted table, generate a sorted code to map to an unsorted code in said each row by ranking a token in said token column of said each row against tokens in said token column.

5. The method of claim 4, wherein said particular database statement includes a window ranking function that ranks over said token column based on an order of tokens in said token column.

6. One or more non-transitory computer-readable media storing one or more sequences instructions for encoding a base table, wherein said one or more sequences of instructions, when executed by one or more processors, cause:
executing a first database statement that specifies to create an unsorted-encoded table from a base table that contains a token column, wherein executing said first database statement causes generating said unsorted-encoded table, wherein said token column contains a plurality of tokens that includes a plurality of distinct tokens, wherein said unsorted-encoded table maps a plurality of unsorted codes to said plurality of distinct tokens, wherein said plurality of unsorted codes do not reflect an order of said plurality of distinct tokens, wherein each unsorted code of said plurality of unsorted codes is mapped by said unsorted-encoded table to a respective distinct token of said plurality of distinct tokens;
executing a second database statement that specifies to create an unsorted-to-sorted table that maps said plurality of unsorted codes to a plurality of sorted codes, wherein executing said second database statement causes generating said unsorted-to-sorted table, wherein each unsorted code of said plurality of unsorted codes is mapped by said unsorted-to-sorted table to a sorted code of said plurality of sorted codes that reflects the order of the respective distinct token of said each unsorted code among the plurality of distinct tokens;
based on the unsorted-to-sorted table, generating a dictionary table, wherein each sorted code of said plurality of sorted codes is mapped by said dictionary table to a respective distinct token of said plurality of distinct tokens; and
encoding the token column based on the dictionary table.

7. The one or more non-transitory computer-readable media of claim 6, wherein the first database statement applies a first encode operator to said token column, wherein said first encode operator generates a distinct code for each distinct token.

8. The one or more non-transitory computer-readable media of claim 7, wherein the first database statement applies a second encode operator to said token column, wherein said second encode operator stores, in a flag column of said unsorted-encode table, flags that each indicate whether a respective unsorted code is a first occurrence of said respective unsorted code.

9. The one or more non-transitory computer-readable media of claim 8, wherein the one or more sequences of instructions include instructions, that when executed by said one or more processors, cause generating the unsorted-to-sorted table includes executing a particular database statement that causes:

- removing duplicates by filtering on said flag column; and
- for each row of said unsorted-to-sorted table, generate a sorted code to map to an unsorted code in said each row by ranking a token in said token column of said each row against tokens in said token column.

10. The one or more non-transitory computer-readable media of claim 9, wherein said particular database statement includes a window ranking function that ranks over said token column based on an order of tokens in said token column.

\* \* \* \* \*

UNITED STATES PATENT AND TRADEMARK OFFICE
CERTIFICATE OF CORRECTION

PATENT NO. : 11,379,450 B2
APPLICATION NO. : 16/155740
DATED : July 5, 2022
INVENTOR(S) : Fender et al.

It is certified that error appears in the above-identified patent and that said Letters Patent is hereby corrected as shown below:

In the Drawings

On sheet 6 of 16, in FIG. 6A, under Reference Numeral 650, Line 2, delete "spares" and insert -- sparse --, therefor.

In the Specification

In Column 3, Line 66, delete "FIG. 10A-B" and insert -- FIGS. 10A-B --, therefor.

In the Claims

In Column 17, Line 45, in Claim 1, delete "column" and insert -- column, --, therefor.

Signed and Sealed this
Twenty-seventh Day of December, 2022

Katherine Kelly Vidal
*Director of the United States Patent and Trademark Office*